US 6,628,042 B2

(12) United States Patent
Tomohiro

(10) Patent No.: US 6,628,042 B2
(45) Date of Patent: Sep. 30, 2003

(54) POLARIZING DEVICE AND METHOD

(75) Inventor: Hiroshi Tomohiro, Shiga-ken (JP)

(73) Assignee: Murata Manufacturing Co., Ltd., Nagaokakyo (JP)

(*) Notice: Subject to any disclaimer, the term of this patent is extended or adjusted under 35 U.S.C. 154(b) by 0 days.

(21) Appl. No.: 10/000,327

(22) Filed: Dec. 4, 2001

(65) Prior Publication Data

US 2002/0089265 A1 Jul. 11, 2002

(30) Foreign Application Priority Data

Dec. 5, 2000 (JP) ........................ 2000-370476

(51) Int. Cl.[7] .......................... H01L 41/22; H01L 41/08
(52) U.S. Cl. ...................... 310/311; 310/359; 264/435; 264/436
(58) Field of Search ................. 310/311, 359; 264/435, 436

(56) References Cited

U.S. PATENT DOCUMENTS

| 4,560,737 A | * 12/1985 | Yamamoto et al. ........... 525/72 |
| RE33,618 E | * 6/1991 | Harnden et al. ........... 29/25.35 |
| 5,426,374 A | * 6/1995 | Taka et al. ................. 324/727 |
| 5,643,353 A | * 7/1997 | Wallace et al. ............... 75/331 |
| 5,758,397 A | * 6/1998 | Inoi et al. ................. 29/25.35 |
| 6,464,925 B1 | * 10/2002 | Tomohiro et al. ........... 264/435 |

FOREIGN PATENT DOCUMENTS

| JP | 58-119687 | * 7/1983 | ................. 310/311 |
| JP | 60-60788 | * 4/1985 | ................. 310/311 |
| JP | 4-262611 | * 9/1992 | ................. 333/148 |
| JP | 9-129943 | * 5/1997 | ............ H01L/41/22 |

* cited by examiner

Primary Examiner—Thomas M. Dougherty
(74) Attorney, Agent, or Firm—Burns, Doane, Swecker & Mathis, LLP

(57) ABSTRACT

In order to polarize a piezoelectric material in high-temperature gas, a temperature-raising portion raises the temperature of the piezoelectric material to a temperature required to polarize the piezoelectric material. A constant-temperature bath has an atmosphere of the temperature of which is kept at the required temperature, and incorporates a polarizing portion that polarizes the piezoelectric material whose temperature is kept at the required temperature. When the temperature of the piezoelectric material is raised quickly to the temperature required to polarize the piezoelectric material by the temperature raising portion and is placed into the constant-temperature bath, the temperature of the piezoelectric material is at a temperature near a set temperature of the inside of the constant-temperature bath, so that the piezoelectric material can be polarized in a short period of time with high precision.

14 Claims, 5 Drawing Sheets

POLARIZING DEVICE AND METHOD

This application is related and claims priority under 35 U.S.C. § 119 to Japanese Patent Application No. 2000-370476, the entirety of which is incorporated by reference.

BACKGROUND OF THE INVENTION

1. Field of the Invention

The present invention relates to a device and a method for polarizing a piezoelectric material in high-temperature gas.

2. Description of the Related Art

Examples of such a polarizing device include a type that polarizes a piezoelectric material by causing the temperature of the piezoelectric material to become a temperature required for polarization (that is, a polarization temperature) inside a constant-temperature bath, and a type that polarizes a piezoelectric material by heating the piezoelectric material to a required polarization temperature using a hot plate.

In the first type, since a constant-temperature bath is used, the temperature of the piezoelectric material can be caused to precisely become the polarization temperature. However, the rate at which the temperature of the piezoelectric material rises is slow, and, since the piezoelectric material is placed in the constant-temperature bath while the piezoelectric material is at ordinary temperature, it takes time for the temperature of the piezoelectric material to reach the polarization temperature. Therefore, it takes a long time to polarize the piezoelectric material.

In addition, since it takes a long time to polarize one piezoelectric material, in order to reduce the time of polarizing many piezoelectric materials, a constant-temperature bath of a size that allows many piezoelectric materials to be placed in it at the same time is required, thereby increasing the size of the entire polarizing device.

In the second type, since the piezoelectric material is heated using a high-temperature hot plate, the temperature of the piezoelectric material rises at a high rate, so that the time required for the temperature of the piezoelectric material to reach a temperature near the polarization temperature can be made short. However, unlike a constant-temperature bath, it takes time to control the setting of the temperature of the piezoelectric material at the polarization temperature with high precision by controlling the temperature of the hot plate. Therefore, as in the first type, the result is that it takes a long time to polarize the piezoelectric material.

SUMMARY OF THE INVENTION

It is an object of the present invention to make it possible to set the temperature of a piezoelectric material at a polarization temperature with high precision within a short period of time, and to make it possible to control a plurality of piezoelectric materials.

It is another object of the present invention to make it possible to set the temperatures of a plurality of piezoelectric materials at a polarization temperature with high precision within a short time without increasing the size of the entire polarizing device.

Other objects will become apparent from the description below.

According to a first aspect of the present invention, there is provided a polarizing device that polarizes a piezoelectric material in high-temperature gas. The polarizing device comprises a temperature raising portion that raises the temperature of the piezoelectric material to a temperature required to polarize the piezoelectric material, and a constant-temperature bath having an atmosphere of gas that is kept at the required temperature and incorporating a polarizing portion that polarizes the piezoelectric material whose temperature is kept at the required temperature.

According to the present invention, since the piezoelectric material has its temperature raised at the temperature raising portion to the temperature required for polarization, when the piezoelectric material is placed into the constant-temperature bath, its temperature is set near the set temperature of the inside of the constant-temperature bath. Therefore, compared to the case where a piezoelectric material at normal temperature is placed in the constant-temperature bath, the time required for the temperature of the piezoelectric material to reach a desired temperature is considerably reduced.

Thereafter, the temperature of the piezoelectric material is set with high precision at the desired high temperature by the constant temperature bath. With the temperature of the piezoelectric material set at this desired temperature with high precision, polarization can be performed with respect to the piezoelectric material at the polarizing portion inside the constant temperature bath. Therefore, the piezoelectric material can be polarized in a short time with high precision.

In this case, since the temperature of one piezoelectric material can be set at the polarization temperature thereof in a short period of time, it is no longer necessary to use a large constant temperature bath to polarize a plurality of piezoelectric materials. Therefore, it is possible to prevent the size of the polarizing device from increasing.

In a first form of the first aspect, the constant-temperature bath further includes an aging portion that performs an aging operation on the piezoelectric material that has been polarized by the polarizing portion. When the first form is realized, it is possible to perform an aging operation on the piezoelectric material as it is at the aging portion, so that, compared to the case where an aging operation is performed on the piezoelectric material from ordinary temperature, the time taken to perform the aging operation can be greatly reduced. Therefore, this structure is preferable.

When the structure of the first aspect or the structure of the first form is used, there may be realized a second form of the first aspect in which the temperature-raising portion heats both surfaces of the piezoelectric material. When the second form is realized, the time required for the temperature of the piezoelectric material to reach the desired temperature can be further reduced. Therefore, this structure is preferable.

When the structure of the second form of the first aspect is used, there may be realized a third form of the first aspect in which the temperature-raising portion includes radiating heating means that heats one of the surfaces of the piezoelectric material by radiation of heat. When the third form is realized, not only one of the surfaces but also the inside of the piezoelectric material can be heated quickly and uniformly to a high temperature, so that the time for the temperature of the piezoelectric material to reach the desired temperature can be further reduced. Therefore, this structure is preferable.

The radiating heating means may be one using near-infrared rays, far infrared rays, or hot air for raising temperature, or any of the other types of radiating heating means.

When the structure of the second form of the first aspect is used, there may be realized a fourth form of the first aspect in which the temperature-raising portion includes means for directly heating the other surface of the piezoelectric material. When the fourth form is realized, the time required for the temperature of the piezoelectric material to reach the desired temperature can be further reduced. Therefore, this structure is preferable.

Examples of the means for direct heating includes a hot plate and any of the other types of means for direct heating.

When the structure of any one of the first form to the fourth form of the first aspect is used, there may be realized a fifth form of the first aspect in which the polarizing device further includes a transport mechanism that transports the piezoelectric material from the temperature-raising portion to the constant-temperature bath, and a control portion that controls transportation of the transport mechanism. The control portion carries out a control operation to operate the transport mechanism, so that the piezoelectric material can be transported from the temperature raising portion to the constant temperature bath. As a result, operations on the piezoelectric material, such as a temperature increasing operation, a constant temperature setting operation at the constant temperature bath, a polarizing operation, and an aging operation can be precisely set or controlled from the outside. Therefore, this structure is preferable.

When the structure of the fifth form of the first aspect is used, there may be realized a sixth form of the first aspect in which the control portion controls time for raising the temperature of the piezoelectric material by the temperature-raising portion, time for setting the temperature of the piezoelectric material at a constant temperature inside the constant-temperature bath, time for polarizing the piezoelectric material by the polarizing portion, and time for performing a or the aging operation by a or the aging portion in order to control the transportation of the transport mechanism based on the time controlling operations. When the sixth form is realized, the operation times of the piezoelectric material, such as the temperature raising time at the temperature raising portion, the constant temperature setting time at a constant temperature, the polarization time, and the aging operation time, can be precisely set. Therefore, this structure is preferable.

When the structure of the sixth form is used, there may be realized a seventh form of the first aspect in which the control portion controls each time so as to be the same or substantially the same. While transporting the piezoelectric material to the temperature raising portion, to the constant temperature setting portion, to the polarizing portion, and to the aging portion by the transport mechanism, the piezoelectric material is subjected to the required operations at the same timing durations. Therefore, it is easier to control the series of polarization operations on the piezoelectric material or to fabricate a piezoelectric material that is uniformly polarized with high precision, so that production yield is increased. Consequently, this structure is preferable.

When the structure of any one of the fifth to seventh forms of the first aspect is used, there may be realized an eighth form of the first aspect in which the piezoelectric material is transported by the transport mechanism while the piezoelectric material is placed at a transport jig. When the eighth form is realized, the production yield with respect to piezoelectric materials is increased.

When the structure of the eighth form of the first aspect is used, there may be realized a ninth form of the first aspect in which the transport jig is in the form of a pallet including a piezoelectric material holdable recess and a through hole in a bottom wall that defines the recess, in which a means or the means for direct heating that is provided at the temperature-raising portion is a hot plate, and in which the hot plate includes a heat transmitting protrusion and a heat transmitting contact surface, the heat transmitting protrusion being insertable into the through hole of the pallet and being contactable through the through hole with a bottom surface of the piezoelectric material that is held in the recess, and the heat transmitting contact surface being contactable with a bottom surface of the pallet.

In such a case, the pallet is heated as a result of coming into contact with the contact surface of the hot plate, so that the piezoelectric material is not cooled at the temperature raising portion, thereby precisely raising the temperature of the piezoelectric material at the temperature raising portion. Therefore, this structure is preferable from the point of view of allowing polarization operations with high precision.

According to a second aspect of the present invention, there is provided a method of polarizing a piezoelectric material inside high-temperature gas. The method comprises the steps of raising the temperature of the piezoelectric material to a temperature required to polarize the piezoelectric material, and polarizing the piezoelectric material as a result of placing the piezoelectric material into an atmosphere of gas whose temperature is maintained at the required temperature. By virtue of this method, the piezoelectric material can be polarized in a short time with high precision.

The method of polarizing a piezoelectric material inside high-temperature gas may further comprise the step of performing an aging operation on the polarized piezoelectric material in the same atmosphere of gas. By virtue of this method, compared to the case where the piezoelectric material is subjected to an aging operation from ordinary temperature, the aging operation time can be greatly reduced.

DETAILED DESCRIPTION OF THE PREFERRED EMBODIMENTS

Hereunder, a description of an embodiment of the present invention will be given in detail with reference to the drawings.

Figure 1:
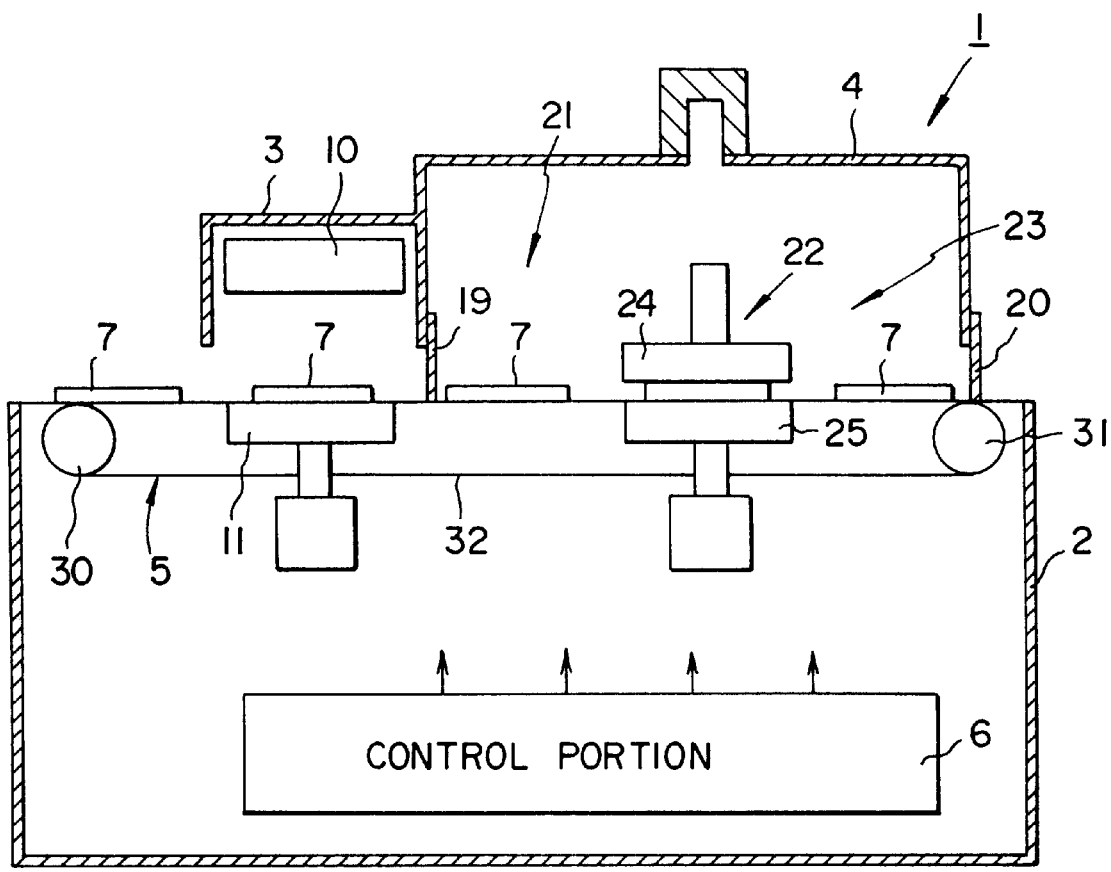
FIG. 1 is a sectional view of the structure of a side surface of an embodiment of a polarizing device in accordance with the present invention, and a block circuit diagram of a control portion incorporated inside the polarizing device.
Figure 2A:
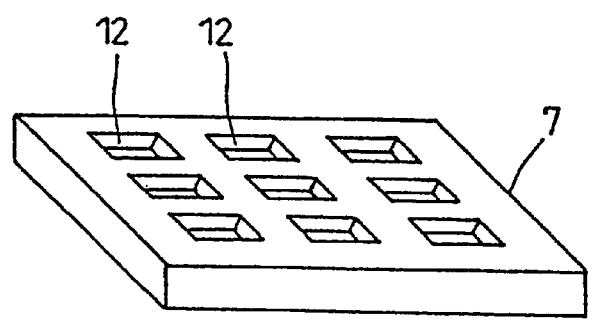
FIGS. 2A and 2B are a perspective view and a side sectional view, respectively, of a pallet shown in FIG. 1.
Figure 2B:
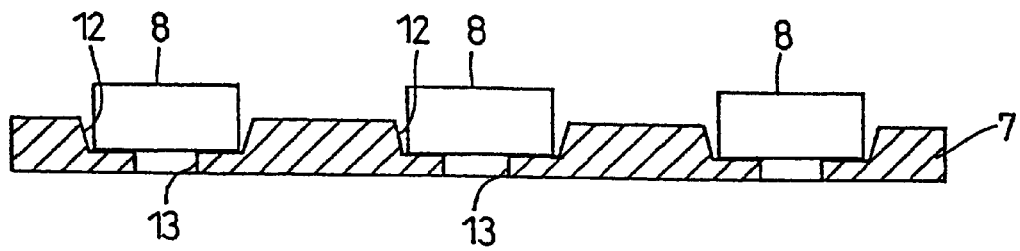
Figure 3A:
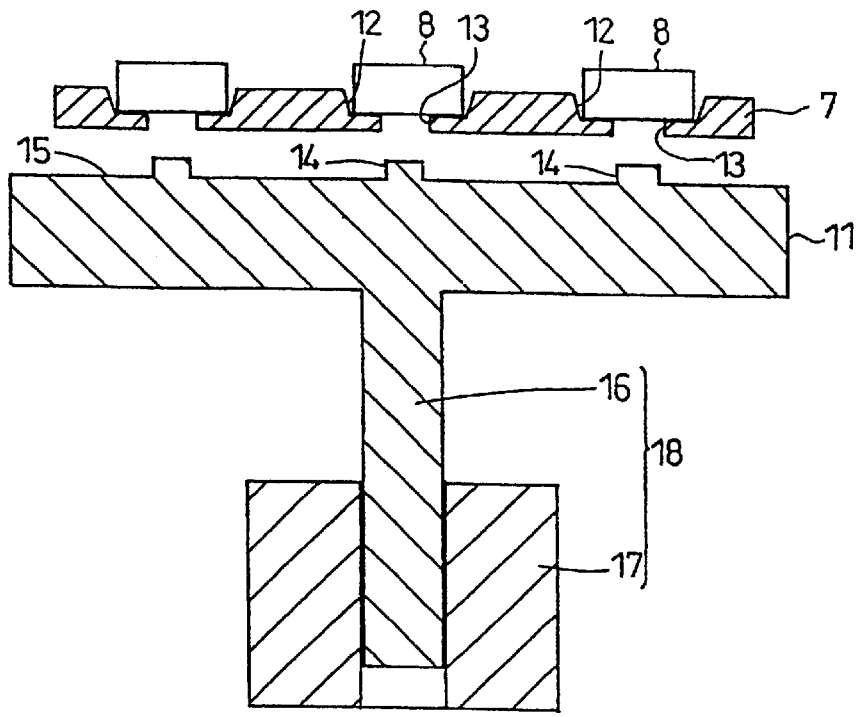
FIGS. 3A and 3B are enlarged views of the pallet and a hot plate inside a temperature raising portion of the polarizing device shown in FIG. 1, with FIG. 3A being a side sectional view thereof before a temperature raising operation and FIG. 3B being a side sectional view thereof during the temperature raising operation.
Figure 3B:
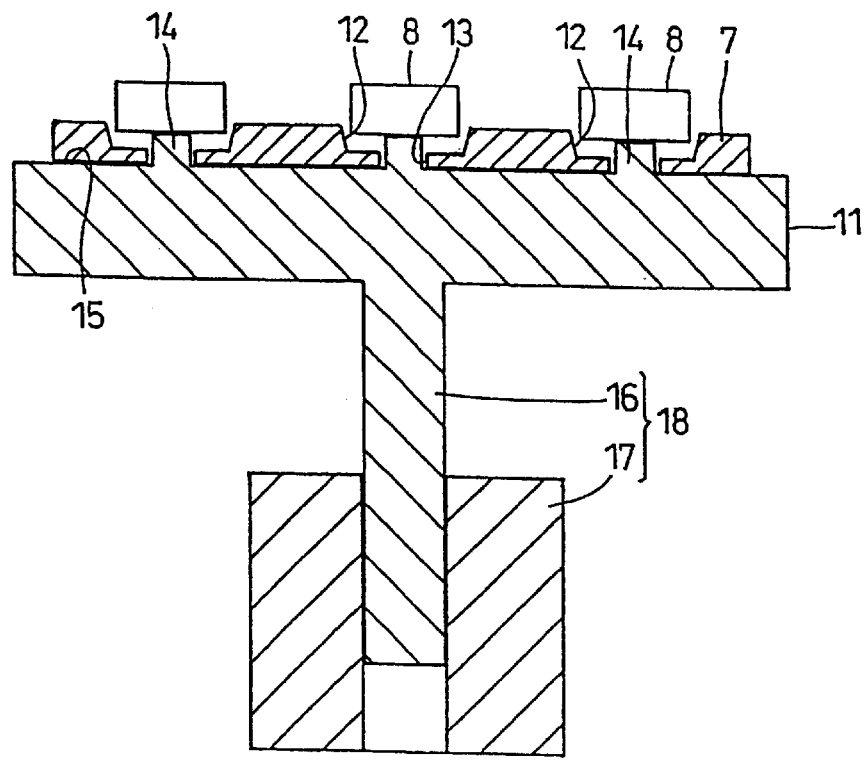
Figure 4A:
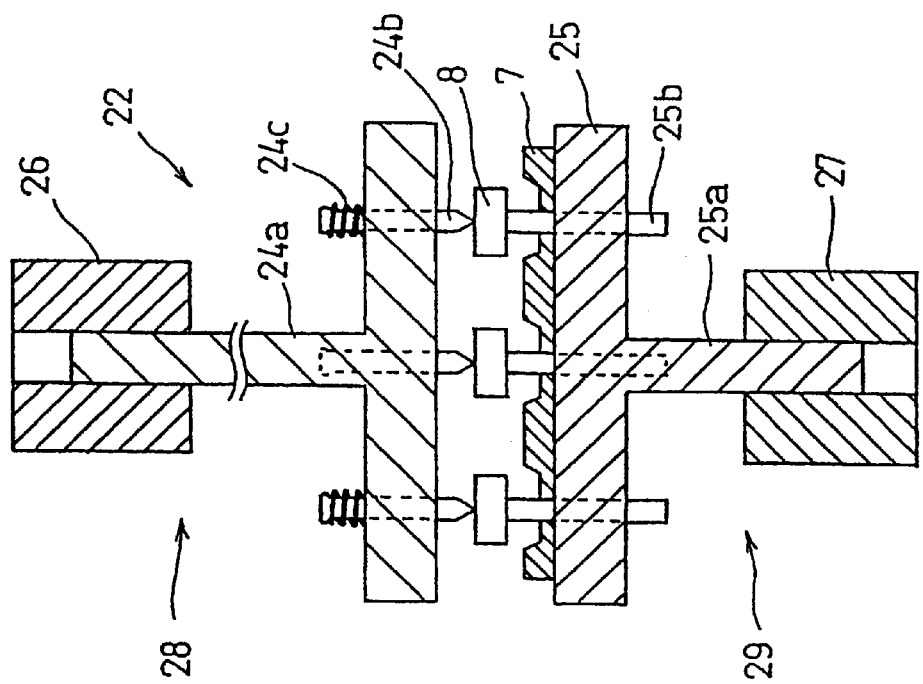
FIGS. 4A and 4B are enlarged views of a polarizing portion inside a constant-temperature bath of the polarizing device shown in FIG. 1, with FIG. 4A being a side sectional view thereof before a polarizing operation and FIG. 4B being a side sectional view thereof during the polarizing operation.
Figure 4B:
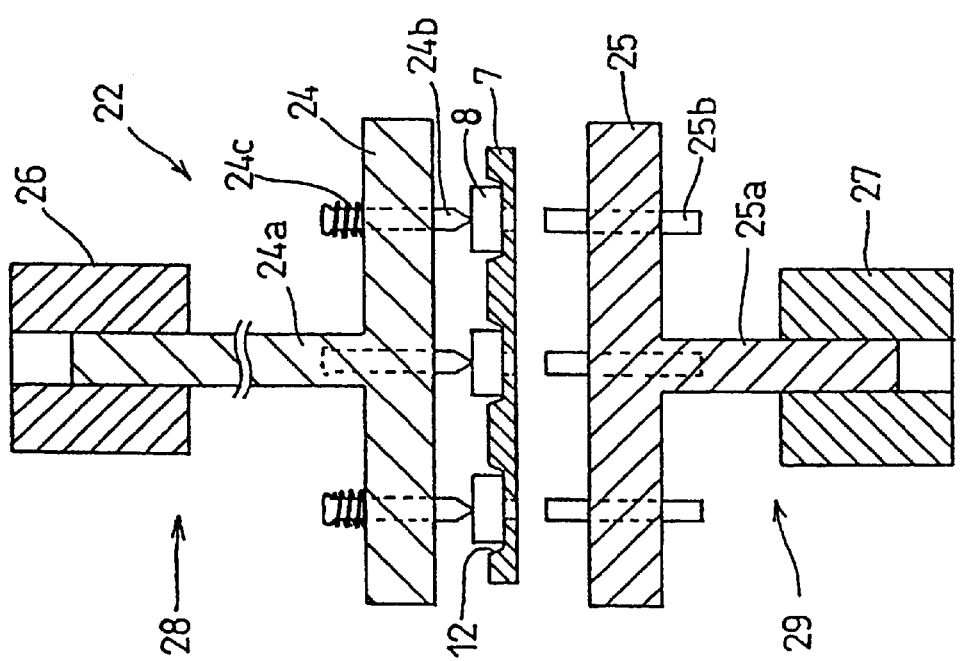
Figure 5:
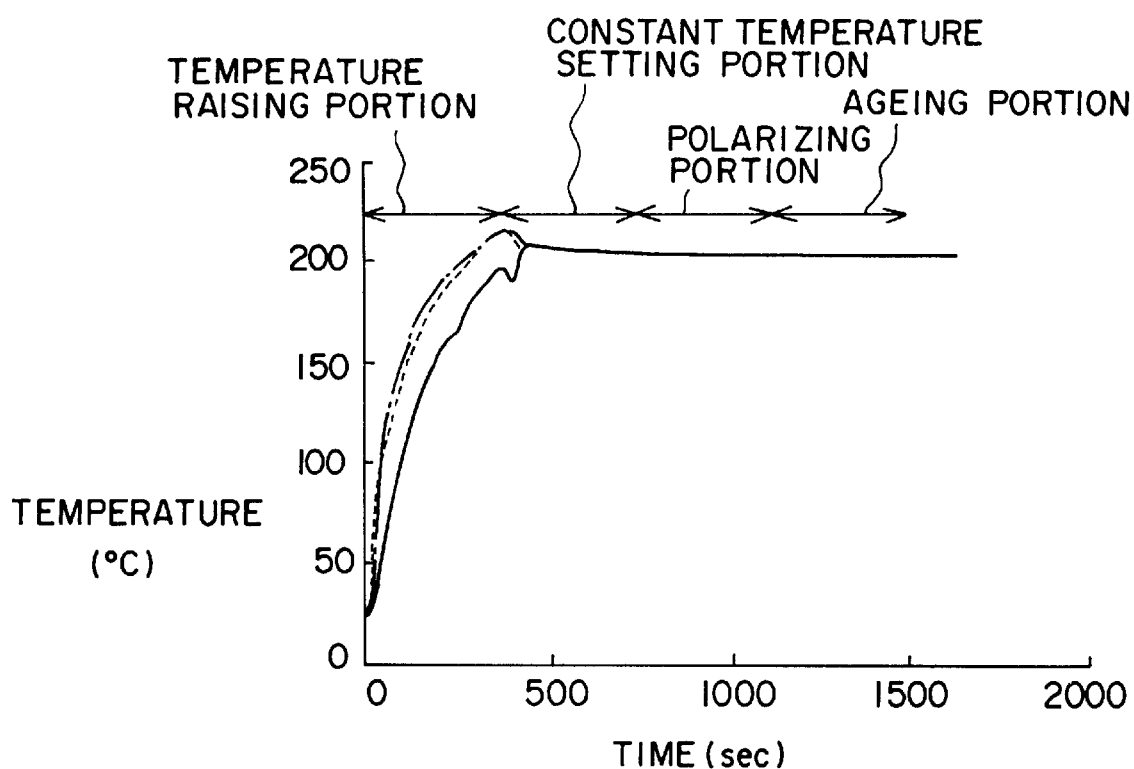
FIG. 5 is a graph showing the relationship between each operation time in terms of the temperature of a piezoelectric material.

FIG. 1 is a sectional view of the structure of a side surface of an embodiment of a polarizing device in accordance with the present invention, and a block circuit diagram of a control portion incorporated inside the polarizing device. FIGS. 2A and 2B are a perspective view and a side sectional view of a pallet shown in FIG. 1, respectively. FIG. 3 is an enlarged view of the pallet and a hot plate inside a temperature raising portion of the polarizing device shown in FIG. 1, with FIG. 3A being a side sectional view thereof before a temperature raising operation and FIG. 3B being a side sectional view thereof during the temperature raising operation. FIG. 4 is an enlarged view of a polarizing portion inside a constant-temperature bath of the polarizing device shown in FIG. 1, with FIG. 4A being a side sectional view thereof before a polarizing operation and FIG. 4B being a side sectional view thereof during the polarizing operation. FIG. 5 is a graph showing the relationship between each operation time in terms of the temperature of a piezoelectric material.

In FIG. 1, reference numeral 1 denotes the entire polarizing device. Reference numeral 2 denotes the body of the polarizing device, reference numeral 3 denotes a temperature raising portion, reference numeral 4 denotes a constant-temperature bath, reference numeral 5 denotes a transport mechanism, reference numeral 6 denotes a control portion, reference numerals 7 denote pallets, and reference numerals 8 denote piezoelectric materials (see, e.g., FIG. 2B).

The temperature raising portion 3 and the constant-temperature bath 4 are disposed on the body 2 of the polarizing device. The transport mechanism 5 and the control portion 6 are provided inside the body 2 of the polarizing device.

Although the temperature distribution is rough, the temperature raising portion 3 can raise the temperatures of the piezoelectric materials 8 at a high rate. The constant-temperature bath 4 has a highly precise gas temperature distribution.

Although not shown, an opening, which a chain belt 32 of the transport mechanism 5 faces, is formed in the top surface of the body 2 of the polarizing device in a transportation direction.

The piezoelectric materials 8 are such as to be placed on the pallets 7 and to be transported along a path of transportation of the transport mechanism 5 from the temperature raising portion 3 to the constant-temperature bath 4.

In the embodiment, the piezoelectric materials 8 that are to be polarized are blocks having electrodes formed on both sides thereof and having thicknesses of from 5 mm to 10 mm. The electrical field, temperature, and time required for polarization are 1.1 kV/mm, 203° C., and 400 seconds, respectively. However, such piezoelectric materials 8 are merely one example of piezoelectric materials, so that any other types of piezoelectric materials may be used as long as they require polarization.

A general description of the operation of the polarizing device will now be given.

The piezoelectric materials 8, which are together placed on the pallets 7, are transported from the temperature raising portion 3 to the constant-temperature bath 4 by the transport mechanism 5. In the transporting process, the temperatures of the piezoelectric materials 8 are quickly raised towards a target control temperature by the temperature raising portion 3, and, then, are placed inside the constant-temperature bath 4. Then, they are subjected to a constant temperature setting operation so that their temperatures are constant at the control temperature. After stabilizing their temperatures by performing the constant temperature setting operation, they are polarized. Thereafter, the piezoelectric materials 8, which are held while their temperatures are stabilized as a result of performing the constant temperature setting operation, are subjected to an aging operation. Finally, the piezoelectric materials 8 are ejected from the constant-temperature bath 4, thereby controlling the temperatures of the piezoelectric materials 8 at a high rate with high precision, so that the time required to polarize the piezoelectric materials 8 can be reduced and a polarization control operation can be carried out with high precision.

Hereunder, a detailed description of the structure of the entire polarizing device 1 of the embodiment of the present invention will be given.

The temperature raising portion 3 has a chamber structure having an open piezoelectric material transportation entrance. The temperature raising portion 3 heats the piezoelectric materials 8 in order to raise the temperatures thereof from ordinary temperature to the aforementioned temperature, e.g., 203° C. (control temperature), which is the temperature required to perform polarization. In order to heat both surfaces of the piezoelectric materials 8 that are placed on the pallets 7, there are provided a near-infrared-ray heater 10, serving as radiating heating means, that heats one of the surfaces of each of the piezoelectric materials 8 as a result of heat radiation, and a hot plate 11 serving as means for directly heating the other surface of each of the piezoelectric materials 8. At the temperature raising portion 3, it is possible to quickly raise the temperature of each of the piezoelectric materials 8 by heating both surfaces of each of the piezoelectric materials 8 at the same time. Since the near-infrared-ray heater 10 does not contact the piezoelectric materials 8, it is possible to reduce mechanical damage to the piezoelectric materials 8. In addition, a mechanical driver as a heat source is not required, which contributes to reducing the size of the polarizing device. Therefore, it is preferable to use the temperature raising portion 3 having this structure.

The heat-generating temperatures of the near-infrared-ray heater 10 and the hot plate 11 themselves are high temperatures, which are equal to or greater than the control temperature. However, as described later, the temperatures of the piezoelectric materials 8 are quickly raised to a temperature that is slightly higher than the control temperature. Here, the near-infrared-ray heater 10 supplies radiant heat to the surface side of each of the piezoelectric materials 8 that is placed upon the corresponding pallet 7, so that not only the surface but also the inside of each of the piezoelectric materials 8 is heated.

Turning to FIG. 2A, the pallets 7, serving as transporting jigs, are plate-shaped and have predetermined thicknesses and rectangular shapes in plan view. The pallets 7 each have a plurality of recesses 12 arranged in rows that can accommodate the piezoelectric materials 8. A through hole 13 is formed in a bottom wall of each of the recesses 12.

Since the piezoelectric materials 8 are transported using the pallets 7, it is possible to prevent the piezoelectric materials 8 from being directly mechanically damaged while they are being transported. In addition, compared to the case where the piezoelectric materials 8 are separately transported, the transportation using the pallets 7 contribute to more simply and more stably performing, for example, a transporting operation and a stopping operation, and to providing more reliable, excellent transportation operations. Therefore, it is preferable to use the pallets 7.

With reference to FIGS. 3A and 3B, the hot plate 11 includes a plurality of heat transmitting protrusions 14 that are insertable into the through holes 13 of the corresponding recesses 12 in the pallets 7. Each of the heat transmitting protrusions 14 can come into contact with the bottom surface of its corresponding piezoelectric material 8, accommodated in the corresponding recesses 12 of the corresponding pallet 7, through the corresponding through hole 13 of the corresponding pallet 7. A surface of the hot plate 11 is a heat transmitting contact surface 15 that can come into contact with the back surface sides of the pallets 7. The hot plate 11 also includes an ascending-and-descending protrusion 16 at the bottom portion thereof.

The heat transmitting protrusions 14 of the hot plate 11 come into contact with the back surfaces of the corresponding piezoelectric materials 8, accommodated in the corresponding recesses 12 of the pallets 7, in order to directly transmit heat to and heat the corresponding piezoelectric materials 8. The heat transmitting contact surface 15 can heat the pallets 7 by coming into contact with the back surfaces of the pallets 7.

Along with a cylinder 17, the ascending-and-descending portion 16 of the hot plate 11 form an ascending-and-descending mechanism 18. The hot plate 11 is moved up and down using a motor (not shown) by controlling the movement of the hot plate 11 into and out of the cylinder 17.

When the hot plate 11 heats the back surfaces of the piezoelectric materials 8, accommodated in the recesses 12 of the pallets 7, the hot plate 11 is moved upward by the ascending-and-descending mechanism 18, so that the heat transmitting protrusions 14 come into contact with the back surfaces of the piezoelectric materials 8. When the pallets 7 are transported, the heat transmitting protrusions 14 are moved downward, so that they are moved out of the corresponding through holes 13 of the pallets 7.

The constant-temperature bath 4 is disposed adjacent the temperature raising portion 3 in the direction in which the piezoelectric materials 8 are transported, and has a chamber structure having an atmosphere of gas that is kept at the temperature required to polarize the piezoelectric materials 8 after blowing hot gas thereto, that is, at the aforementioned control temperature. Opening-and-closing shutters 19 and 20 (see FIG. 1) are provided at a pallet-7-transportation entrance and a pallet-7-transportation exit, respectively. The hot-gas blowing structure is not shown.

In the order of portions of the constant-temperature bath 4 to which the piezoelectric materials 8 are transported, there are provided in the transportation path inside the constant-temperature bath 4: a constant temperature setting portion 21 that performs a constant temperature setting operation; a polarizing portion 22 that performs polarization; and an aging portion 23 that performs an aging operation. These portions perform their operations on the piezoelectric materials which are placed on the pallets 7 and which are transported towards the constant-temperature bath 4 from the temperature raising portion 3 by the transport mechanism 5.

The constant temperature setting portion 21 is the place where the temperatures of the piezoelectric materials 8 that have been transported from the temperature raising portion 3 by the transport mechanism 5 are set so that they are constant at the control temperature of 203° C. At this place, the transport mechanism 5 stops for a required period of time, e.g. 400 seconds. The temperatures of the piezoelectric materials 8 that are placed on the pallets 7 have already been raised to a temperature that is slightly higher than the control temperature by the temperature raising portion 3. During the stopping time, the temperatures of the piezoelectric materials 8 are set so that they are constant at the control temperature.

The polarizing portion 22 includes a pair of upper and lower electrodes 24 and 25 that apply a voltage to each of the piezoelectric materials 8 as a result of coming into contact with the piezoelectric electrodes on both surfaces of each piezoelectric material 8 that is placed on the corresponding pallet 7 which has been transported from the constant temperature setting portion 21 by the transport mechanism 5. The upper electrode 24 applies high voltage, and the lower electrode 25 is kept at ground potential.

Turning now to FIGS. 4A and 4B, the upper and lower electrodes 24 and 25 include protrusions 24a and 25a, respectively. Along with corresponding cylinders 26 and 27, the upper and lower electrodes 24 and 25 form ascending-and-descending mechanisms 28 and 29, respectively. The upper and lower electrodes 24 and 25 can move up and down as a result of moving the protrusions 24a and 25a into and out of the cylinders 26 and 27 by a motor (not shown). Even at the polarizing portion 22, the transportation of the transport mechanism 5 is stopped for a required period, e.g., 400 seconds.

A plurality of electrically conductive voltage applying pins 24b are formed in the upper electrode 24 so as to be movable up and down. One end side of each voltage applying pin 24b is connected to a high-voltage power supply, and the other end of each voltage applying pin 24b is provided with a spring 24c that can urge the top surface of each of the piezoelectric materials 8 on the corresponding pallet 7 in the downward direction.

A plurality of electrically conductive ground pins 25b are inserted into the lower electrode 25. One side end of each ground pin 25b is connected and grounded to a ground portion, and the other end of each ground pin 25b is provided so that it can push upward the bottom surface of its corresponding piezoelectric material 8 as a result of passing through the through hole 13 of the corresponding recess 12 of the corresponding pallet 7.

The aging portion 23 is a place where an aging operation is performed on each of the piezoelectric materials 8 that is placed on the pallets 7. Even at this place, the transportation of the transport mechanism 5 is stopped for a required period of time, e.g., 400 seconds. By disposing the aging portion 23 inside the constant-temperature bath 4, it is possible to perform an aging operation on each of the piezoelectric materials 8 at a uniform temperature, so that it becomes unnecessary to raise the temperature to that required for the aging operation. Therefore, the aging operation can be carried out in a short period of time.

The transport mechanism 5 is formed by winding the chain belt 32 between a driving wheel 30 and a driven wheel 31. The driving wheel 30 includes a motor device that drives the chain belt 32, and transports the pallets 7 by driving the chain belt 32 at a required speed. Here, the driving wheel 30 stops driving the chain belt 32 for, e.g., 400 seconds at each of the temperature raising portion 3, the constant temperature setting portion 21, the polarizing portion 22, and the aging portion 23 inside the constant temperature bath 4.

The control portion 6 includes a microcomputer, a random access memory (RAM), a read only memory (ROM), an input interface, and an output interface. The control portion 6 is constructed so as to control the temperature raising portion 3, the constant-temperature bath 4, and the transport mechanism 5. In controlling the temperature raising portion 3, application of heating voltage to the near-infrared-ray heater 10 and the hot plate 11, and the upward and downward movement of the hot plate 11 are controlled. In controlling the constant-temperature bath 4, it controls the blowing of hot gas, controls the opening-and-closing shutters 19 and 20, disposed at the pallet-7-transportation entrance and at the pallet-7-transportation exit, respectively, in order to synchronously open and close them, and controls the application of voltage and the upward and downward movement of the upper and lower polarization electrodes 24 and 25 of the polarizing portion 22. In controlling the transport mechanism 5, the driving operation of the driving wheel 30 is controlled.

Hereunder, a description of the operation of the polarizing device will be given with reference to FIG. 5.

The control portion 6 causes operation of the near-infrared-ray heater 10 and the hot plate 11 of the temperature raising portion 3 by applying a heating voltage thereto, and causes hot gas to be sent into the constant-temperature bath 4 and controls the temperature inside the constant-temperature bath 4 at the control temperature of, e.g., 203° C.

Then, the control portion 6 sends a control signal to the driving wheel 30 of the transport mechanism 5, and rotates the driving wheel 30, thereby moving the chain belt 32. This causes each of the pallets 7 on the chain belt 32 to be sent to the temperature raising portion 3.

When a pallet 7 is sent into the temperature raising portion 3, the control portion 6 stops the driving wheel 30 in order to stop the transportation of the pallet 7 for, e.g., 400 seconds. In addition, the control portion 6 controls the ascending-and-descending mechanism 18 to move the hot plate 11 upward. This causes the corresponding heat transmitting protrusions 14 of the hot plate 11 to be inserted into the corresponding through holes 13 in the bottom walls of the corresponding recesses 12 of the corresponding pallet 7, and to come into contact with the back surfaces of the corresponding piezoelectric materials 8 held by the corresponding pallet 7. In this way, inside the temperature raising portion 3, the front surface and back surface of each of the piezoelectric materials 8 are heated by the near-infrared-ray heater 10 and by the hot plate 11, respectively, to quickly raise their temperatures to a temperature that is slightly higher than the control temperature of 203° C.

When the temperatures of the piezoelectric materials 8 have been raised, the control portion 6 causes the opening-and-closing shutters 19 and 20 of the constant-temperature bath 4 to open, and the driving wheel 30 to be driven again, so that the pallet 7 that has been sent into the temperature-raising portion 3 is sent into the constant-temperature bath 4 by the chain belt 32.

When the pallet 7 reaches the constant temperature setting portion 21 inside the constant-temperature bath 4, the control portion 6 stops the driving wheel 30 in order to stop the transportation of the pallet 7 for, e.g., 400 seconds, so that the piezoelectric materials 8 on the pallet 7 at the constant temperature setting portion 21 are subjected to a constant temperature setting operation. This causes the temperatures of the piezoelectric materials 8 to become constant at the control temperature of, e.g., 203° C.

When the constant temperature setting operation has been completed, the control portion 6 starts driving the driving wheel 30 again in order for the pallet 7 to reach the polarizing portion 22. Before the pallet 7 reaches the polarizing portion 22, the control portion 6 sends control signals to the ascending-and-descending mechanisms 28 and 29 for the upper and lower polarization electrodes 24 and 25 of the polarizing portion 22 in order to cause both the upper and lower polarization electrodes 24 and 25 to be out of the transportation path. When this pallet 7 reaches the polarizing portion 22, the control portion 6 stops the driving wheel 30 in order to stop the transportation of the pallet 7 for, e.g., 400 seconds, and sends control signals to the ascending-and-descending mechanisms 28 and 29 in order to lower both the upper and lower polarization electrodes 24 and 25 downwards towards the transportation path. This causes the pins 24b and pins 25b of the corresponding polarization electrodes 24 and 25 to come into contact with the piezoelectric electrodes on both surfaces of each of the piezoelectric materials 8 held by the pallet 7 at the polarizing portion 22. In this state of contact, the control portion 6 causes a high voltage to be applied across the upper and lower polarization electrodes 24 and 25 by a high-voltage power supply for, e.g., 400 seconds.

In this case, by the lower polarization electrode 25, each of the piezoelectric materials 8 on the pallet 7 at the polarizing portion 22 is lifted upward a little, so that each of them moves out of contact with the pallet 7. Therefore, during the polarization, creeping discharge, which is generated as a result of application of a high voltage from the upper polarization electrode 24, is produced towards the lower polarization electrode 25, but is not produced along the pallet 7, thereby making this structure preferable. The pallet 7 is in contact with the chain belt 32, and is connected to a ground side, which is different from the ground of the lower polarization electrode 25 because, when creeping discharge is generated towards the ground of the device, the device may become defective or the like.

When the polarization of each of the piezoelectric materials 8 is completed, the control portion 6 starts driving the driving wheel 30, causing the pallet 7 to reach the aging portion 23. Then, when the pallet 7 has reached the aging portion 23, the control portion 6 stops the driving wheel 30 in order to stop the transportation of the pallet 7 for, e.g., 400 seconds, so that an aging operation is performed on each of the piezoelectric materials 8 on the pallet 7 at the aging portion 23. Accordingly, each of the piezoelectric materials 8 is subjected to an aging operation for, e.g., 400 seconds at the control temperature of, e.g., 203° C.

After the aging operation, the control portion 6 causes the opening-and-closing shutters 19 and 20 of the constant-temperature bath 4 to open in order to discharge the pallet 7 at the aging portion 23 after the aging operation out of the constant-temperature bath 4.

In this way, since the temperatures of the piezoelectric materials 8 are increased to the temperature required for polarization by the temperature raising portion 3, when they are placed in the constant-temperature bath 4, their temperatures have already reached a temperature near the set temperature of the inside of the constant-temperature bath 4. Therefore, compared to the case where the piezoelectric materials 8 are at an ordinary temperature when they are placed in the constant-temperature bath 4, the time required to cause the piezoelectric material temperatures to reach a desired temperature is considerably reduced.

Thereafter, the temperature of each of the piezoelectric materials 8 is set with high precision at the desired high temperature by the constant temperature bath 4. With the temperatures of the piezoelectric materials 8 set at this desired temperature with high precision, polarization can be performed with respect to each of the piezoelectric materials 8 at the polarizing portion 22 inside the constant temperature bath 4. Therefore, the piezoelectric materials 8 can be polarized in a short time with high precision.

The control portion 6 controls the transport mechanism 5 by controlling each of: the time required to raise the temperatures of the piezoelectric materials 8 by the temperature raising portion 3; the time required to set the temperatures of the piezoelectric materials 8 at the constant temperature at the constant temperature setting portion 21 inside the constant temperature bath 4; the time required to perform polarization at the polarizing portion 22; and the time required to perform an aging operation at the aging portion 23 so that these times are all the same, e.g., 400 seconds, as shown in FIG. 5. Even though the temperature rise at the front surface (indicated by the solid line), the temperature rise at the inside (indicated by the alternate short and long dashed line), and the temperature rise at the back surface (indicated by the dotted line) of each piezoelectric material 8, caused by the temperature raising portion 8, vary slightly, during the polarizing operation, they are the same, e.g., 203° C. inside the constant-temperature bath 4 so that the polarizing operation can be performed with high precision.

The present invention is not limited to the above-described embodiment, so that various other applications and modifications may be made.

(1) In the above-described embodiment, in order to, by stopping the chain belt 23, perform the corresponding operations for 400 seconds at each of the pallets 7 at the predetermined locations (stations), that is, at the temperature raising portion 3, the constant temperature setting portion 21, the polarizing portion 22, and the aging portion 23 inside the constant-temperature bath 4, the stations are separated by equal distances from each other. Therefore, when any one of the pallets 7 is not at a predetermined station while another pallet 7 is at its predetermined station, the pallet 7 that has not reached the corresponding station may be lifted by a pallet ascending-and-descending mechanism (not shown) in order to be positioned and set at the predetermined station.

(2) In the above-described embodiment, the chain belt 32 is used as the transport mechanism 5. The chain belt 32 may be formed of metal or resin. Transport mechanisms other than chain belts may also be used.

According to the present invention, since the piezoelectric materials have their temperatures raised at the temperature raising portion to the temperature required for polarization, when the piezoelectric materials are placed into the constant-temperature bath, their temperatures are set at near the set temperature of the inside of the constant-temperature bath. Therefore, compared to the case where piezoelectric materials at normal temperatures are placed in the constant-temperature bath 4, the time required for the temperatures of the piezoelectric materials to reach a desired temperature is considerably reduced.

Thereafter, the temperatures of the piezoelectric materials 8 are set with high precision at the desired high temperature in the constant temperature bath 4. With the temperature of the piezoelectric materials being set at this temperature with high precision, polarization can be performed on the piezoelectric materials at the polarizing portion inside the same constant-temperature bath. As a result, the polarization on the piezoelectric materials can be carried out in a short time with high precision.

While the invention has been described in detail with reference to preferred embodiments thereof, it will be apparent to one skilled in the art that various changes can be made, and equivalents employed, without departing from the scope of the invention. Each of the aforementioned documents is incorporated by reference herein in its entirety.

What is claimed is:

1. A polarizing device useful for polarizing a piezoelectric material having two surfaces in high-temperature gas, the polarizing device comprising:

temperature-raising portion for raising the temperature of the piezoelectric material to a temperature required to polarize the piezoelectric material; and a constant-temperature bath having an atmosphere of gas that is kept at the required temperature, the constant-temperature bath incorporating a polarizing portion for polarizing the piezoelectric material while the temperature of the piezoelectric material is kept at the required temperature, wherein the temperature-raising portion and the constant-temperature bath are separated from each other.

2. A polarizing device according to claim 1, wherein the constant-temperature bath further comprises an aging portion for performing an aging operation on the piezoelectric material that has been polarized by the polarizing portion.

3. A polarizing device according to claim 1, wherein the temperature-raising portion is configured and arranged to heat both surfaces of the piezoelectric material.

4. A polarizing device according to claim 3, wherein the temperature-raising portion includes radiating heating means for heating one of the surfaces of the piezoelectric material by radiation of heat.

5. A polarizing device according to claim 3, wherein the temperature-raising portion includes means for directly heating one of the surfaces of the piezoelectric material.

6. A polarizing device according to claim 1, further comprising:

a transport mechanism for transporting the piezoelectric material from the temperature-raising portion to the constant-temperature bath; and a control portion that controls transportation of the transport mechanism.

7. A polarizing device according to claim 6, wherein the control portion controls a time selected from the group consisting of:
time for raising the temperature of the piezoelectric material by the temperature-raising portion;
time for setting the temperature of the piezoelectric material at a constant temperature inside the constant-temperature bath;
time for polarizing the piezoelectric material by the polarizing portion; and
time for performing an aging operation, wherein the constant-temperature bath further comprises an aging portion for performing an aging operation on the piezoelectric material that has been polarized by the polarizing portion; and
combinations thereof;

wherein the control portion controls in order to control the transportation of the transport mechanism based on the above time controlling operations.

8. A polarizing device according to claim 7, wherein the control portion controls the time of each operation so as to be substantially the same.

9. A polarizing device according to claim 6, further comprising a transport jig for receiving the piezoelectric material, the transport mechanism transporting the transport jig.

10. A polarizing device according to claim 9, wherein the transport jig comprises a pallet including a bottom wall, a piezoelectric material holdable recess, and a through hole in the bottom wall; and the temperature-raising portion further comprising means for direct heating including a hot plate, the hot plate including heat transmitting protrusion and a heat transmitting contact surface, the heat transmitting protrusion being configured and arranged to be insertable into the through hole of the pallet and to be contactable through the through hole with a bottom surface of the piezoelectric material when accommodated in the recess, and the heat transmitting contact surface being contactable with a bottom surface of the pallet.

11. A method of polarizing a piezoelectric material inside high-temperature gas, the method comprising the steps of:

raising the temperature of the piezoelectric material, located at a first location, to a temperature required to polarize the piezoelectric material; and polarizing the piezoelectric material by placing the piezoelectric material at a second location, separated from the first location, into an atmosphere of gas the temperature of which is maintained at the required temperature.

12. A method of polarizing a piezoelectric material inside high-temperature gas according to claim 11, further comprising the step of:

performing an aging operation on the polarized piezoelectric material in the same atmosphere of gas.

13. A polarizing device according to claim 1, further comprising:

a piezoelectric material in the polarizing device.

14. A polarizing device according to claim 5, wherein the means for direct heating comprises a hot plate, the hot plate including heat transmitting protrusions and a heat transmitting contact surface.

* * * * *